United States Patent [19]

Cushing et al.

[11] 4,438,493

[45] Mar. 20, 1984

[54] MULTIWORK MEMORY DATA STORAGE AND ADDRESSING TECHNIQUE AND APPARATUS

[75] Inventors: David E. Cushing, Chelmsford; Philip E. Stanley, Westboro, both of Mass.

[73] Assignee: Honeywell Information Systems Inc., Waltham, Mass.

[21] Appl. No.: 280,720

[22] Filed: Jul. 6, 1981

[51] Int. Cl.³ .............................................. G06F 13/00
[52] U.S. Cl. .................................................... 364/200
[58] Field of Search ................................ 364/200, 900

[56] References Cited

U.S. PATENT DOCUMENTS

| | | | |
|---|---|---|---|
| 4,008,462 | 2/1977 | Kanda | 364/200 |
| 4,045,781 | 8/1977 | Levy et al. | 364/200 |
| 4,055,851 | 10/1977 | Jenkins et al. | 364/200 |
| 4,099,231 | 7/1978 | Kotok et al. | 364/200 |
| 4,151,593 | 4/1979 | Jenkins et al. | 364/200 |
| 4,236,203 | 11/1980 | Curley et al. | 364/200 |
| 4,361,869 | 11/1982 | Johnson et al. | 364/200 |

*Primary Examiner*—Eddie P. Chan
*Assistant Examiner*—Daniel K. Dorsey

*Attorney, Agent, or Firm*—William A. Linnell; Nicholas Prasinos

[57] ABSTRACT

A technique and apparatus for storing data and addressing stored data in a memory from which multiple words of data are to be retrieved in parallel is disclosed. The memory is addressed by providing the address of the first of N consecutive words to be retrieved in parallel. The data is stored in memory in physical data words which contain N logical data words such that the addressing of one physical data word will result in N logical data words being read in parallel from the memory. Each physical data word contains the contents of the logical data word having the same address as that of the physical data word in its leftmost position followed in the next right position by the contents of the logical data word having the next higher address, and so on until the rightmost position of the physical data word contains the contents of the logical data word with an address equal to the physical data word address plus N−1. This results in the contents of each logical data word being stored N times in the memory, but eliminates the need for data alignment as the N logical data words are read in parallel from the memory.

8 Claims, 3 Drawing Figures

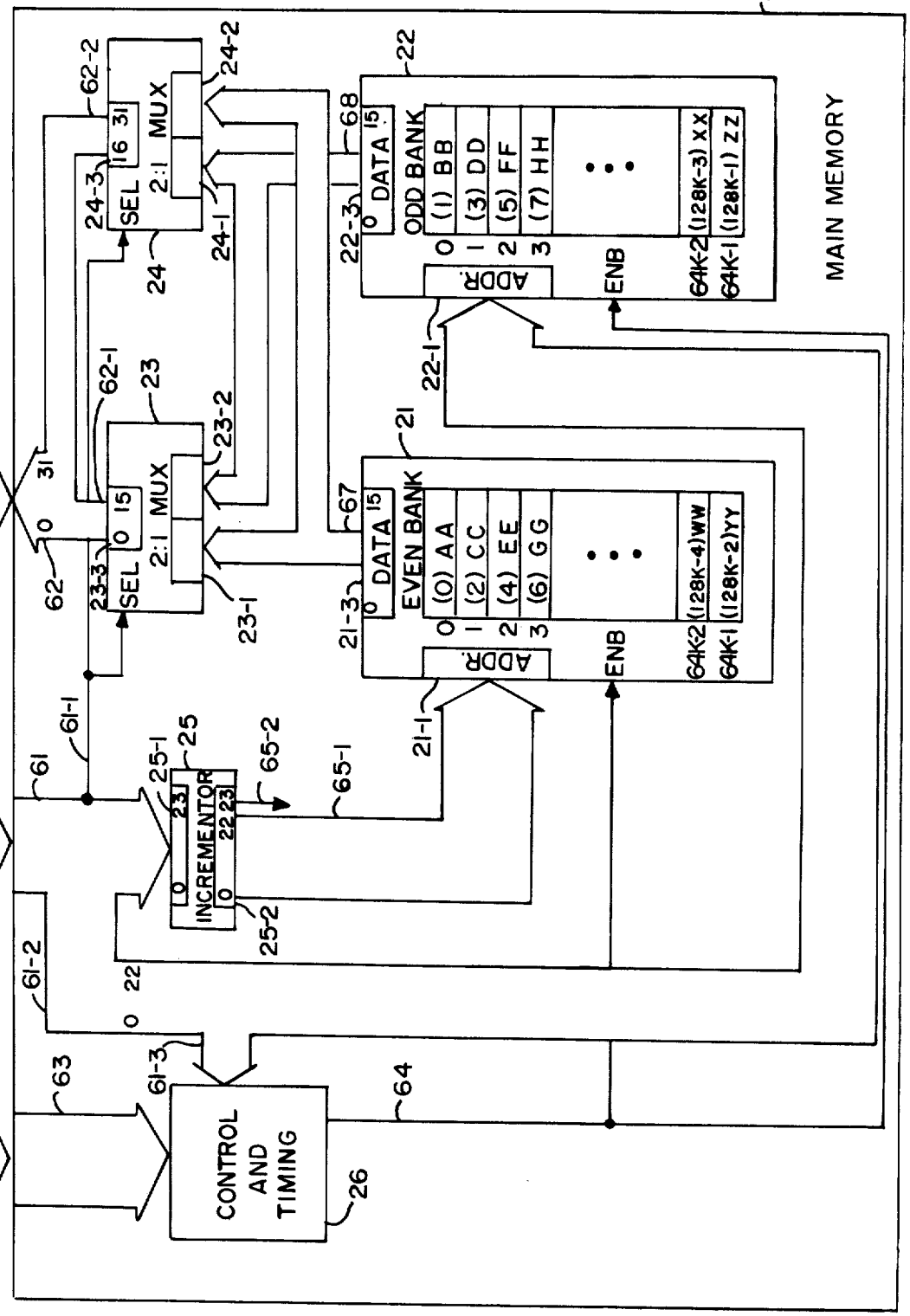

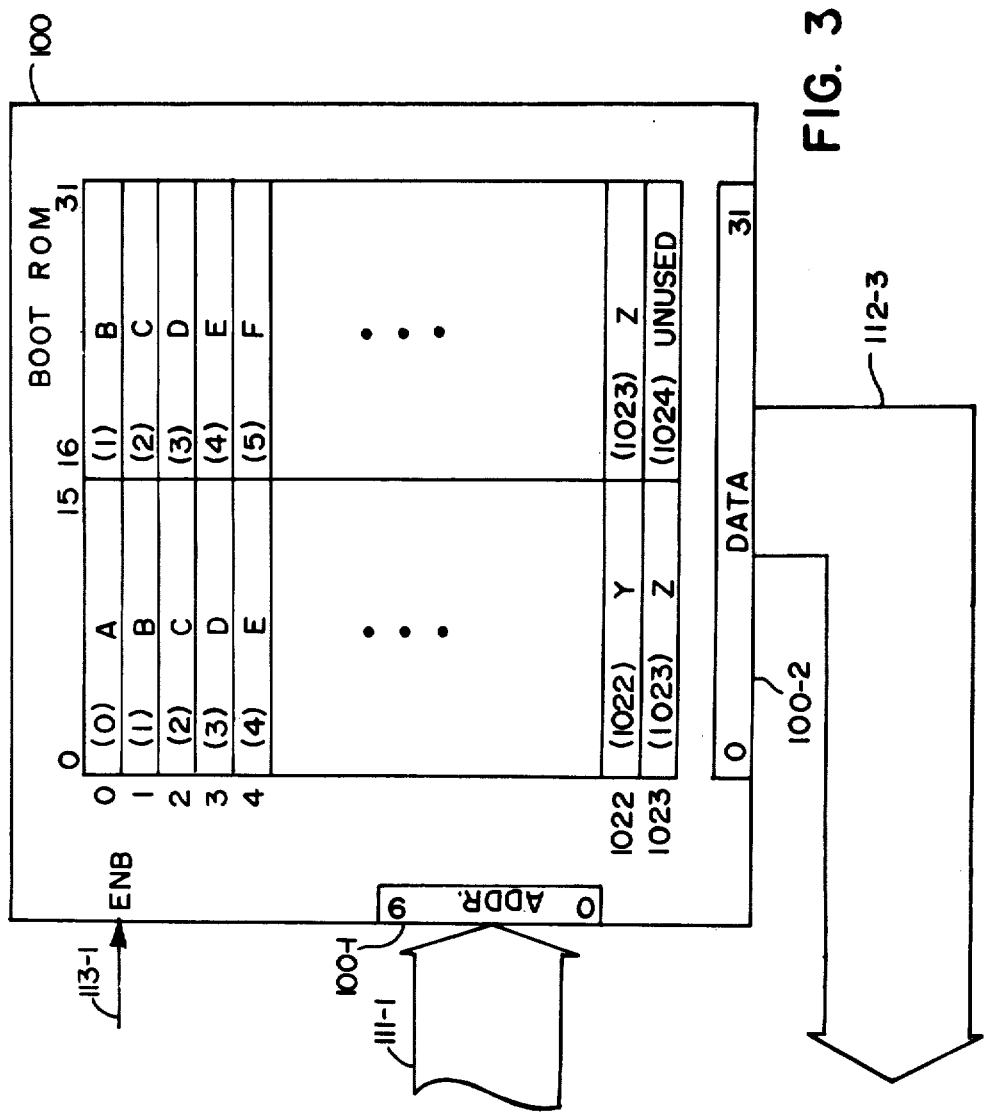

MULTIWORK MEMORY DATA STORAGE AND ADDRESSING TECHNIQUE AND APPARATUS

BACKGROUND OF THE INVENTION

1. Field of the Invention

The invention relates to a technique and apparatus for storing and addressing data in the memory of a computer system and more particularly to a technique and apparatus for storing and addressing a memory in which multiple words of data are to be transferred over a multiple word wide data bus.

2. Description of the Prior Art

In most modern computer systems, the data within memory is organized into fixed length words. Each word is comprised of a fixed number of bits and is referenced by an address which indicates the word's position within the memory. In most computer systems, the memory addresses are binary encoded and are transferred to the memory on a data bus which contains as many signal lines as there are binary digits (bits) required to represent the highest word address. For example, if a memory contains 1,024 words of data, contained in addresses 0 through 1,023, the memory would be addressed by providing a binary encoded address consisting of 10 bits (1,111,111,111 binary equals 1,023 decimal which is the address of the last location in memory).

In many modern minicomputers, the data words are organized in words of 16 bits each, and each time that the memory is referenced by an address on an address bus, the memory responds by either reading a 16-bit word from memory and placing it on the data bus or takes a 16-bit word from the data bus and writes it into the addressed location in memory. The memory does a read or a write depending upon control signals appearing on a control bus.

Minicomputers have now evolved to the point where super-minicomputers are now appearing on the market. These super-minicomputers are of higher performance than the minicomputers. This higher performance of the super-minicomputers is achieved by providing faster circuits within these central processing units (CPU), by processing more data in parallel, by having faster bus transfer rates, by having faster memories, and by a variety of other techniques. Because the cost of developing software is relatively high compared to the purchase price of a super-minicomputer, manufacturers of minicomputers who have produced super-minicomputers have made the super-minicomputer software compatible with their earlier minicomputers so that software which executes on their minicomputer will also execute on their super-minicomputer.

One way of increasing the performance of a minicomputer to produce a super-minicomputer is to have the super-minicomputer process multiple words of data in parallel such that when the super-minicomputer references the memory and provides a memory address of a 16-bit data word, the memory of the super-minicomputer will retrieve or store multiple 16-bit words in parallel. For example, if the CPU of a super-minicomputer wants to read location 1,000 from memory, the CPU can place the address of location 1,000 on the address bus and the main memory will retrieve the contents of location 1,000 and location 1,001 (the next addressed location) and return the two 16-bit data words in parallel on a data bus which is 32 bits wide (twice as wide as the 16-bit data bus on the previous minicomputer).

One method of organizing the memory of a super-minicomputer so that it can retrieve multiple words in parallel is to organize the memory to have an even bank and an odd bank such that all even addressed words are contained in the even bank and all odd addressed words are contained in the odd bank. Using this organization, if location 1,000 and location 1,001 are to be read from main memory, the main memory will read the contents of location 1,000 from the even bank and the contents of location 1,001 from the odd bank and place them on the bus such that the address location is in the leftmost word on the data bus and the address location plus one is in the rightmost word of the data bus. In this example, location 1,000 from the even bank would be in the leftmost word on the data bus and the contents of location of 1,001 from the odd bank would be in the rightmost word of the data bus. However, if locations 1,001 and 1,002 are to be read from memory, location 1,001 would be read from the odd bank and placed in the leftmost word on the data bus and location 1,002 would be read from the even bank and placed in the rightmost word on the data bus. As can be seen from the above examples, in some cases the word read from the even bank appears in the leftmost word on the data bus; in the other cases, the word read from the odd bank will appear in the leftmost word on the data bus. The rule being that the addressed word always appears in the leftmost word and the addressed word plus one appears in the rightmost word on the data bus. In order to achieve this alignment of the words on a multiword wide data bus, there is usually a crossbar arrangement within the main memory to align the data as it is read from memory and placed on the data bus or to align the data as it is taking from the data bus and written into the main memory. In addition to this crossbar logic, the main memory must also have the ability to increment by one the address presented by the address bus so that it may compute the address of the second location to be read from memory.

This crossbaring of the data from or to the data bus as this information is written to or read from main memory and the incrementing of the address requires logic within the memory. The propagation time of the various signals through the address incrementing and crossbaring logic increases the memory response time.

What is needed, therefore, is a technique and apparatus for eliminating the need of crossbaring data as multiple words of data are read from memory in parallel and a means for eliminating the requirement to increment the address of the first word of multiple words of data which are to be retrieved from a memory.

OBJECTS OF THE INVENTION

Hence, it is the object of the present invention to design a memory such that the retrieval of multiple words of data can be accomplished without requiring the incrementing of the address of the first word of data and without requiring the crossbaring of data between the memory and the data bus.

It is another object of the present invention to provide a fast memory which will provide multiple words of data in response to the address of a first word of data presented to it.

It is another object of the present invention to provide an inexpensive memory capable of providing multiple words of data at the outputs thereof in response to the address of a first word of data.

SUMMARY OF THE INVENTION

Consequently, the present invention relates to a memory in which each physical location in memory contains multiple logical words of data. The leftmost word of each physical word contains the contents of the logical word whose address corresponds to the address of the physical location, the next logical word to the right of the leftmost word contains the contents of the logical word corresponding to the address of the physical location plus one and the next right logical word within the physical word containing the contents of the logical word equal to the address of the previous logical word incremented by one. This arrangement of the memory results in the memory containing as many copies of each logical word as are to be returned in parallel on the data bus. Organizing the memory in this manner eliminates the need for any crossbaring the data between the main memory and the data bus and further eliminates the need for incrementing the address presented to the memory.

BRIEF DESCRIPTION OF THE DRAWINGS

The manner in which the apparatus of the present invention is constructed and its mode of operation can be understood in light of the following detailed description together with the accompanying drawings in which like reference numbers identify like elements in the several figures and in which:

FIG. 2 is a detailed block diagram of the main memory of the system in FIG. 1; and FIG. 3 is a detailed block diagram of the boot ROM of the system in FIG. 1 showing the instant invention.

DESCRIPTION OF THE PREFERRED EMBODIMENT

Figure 1:
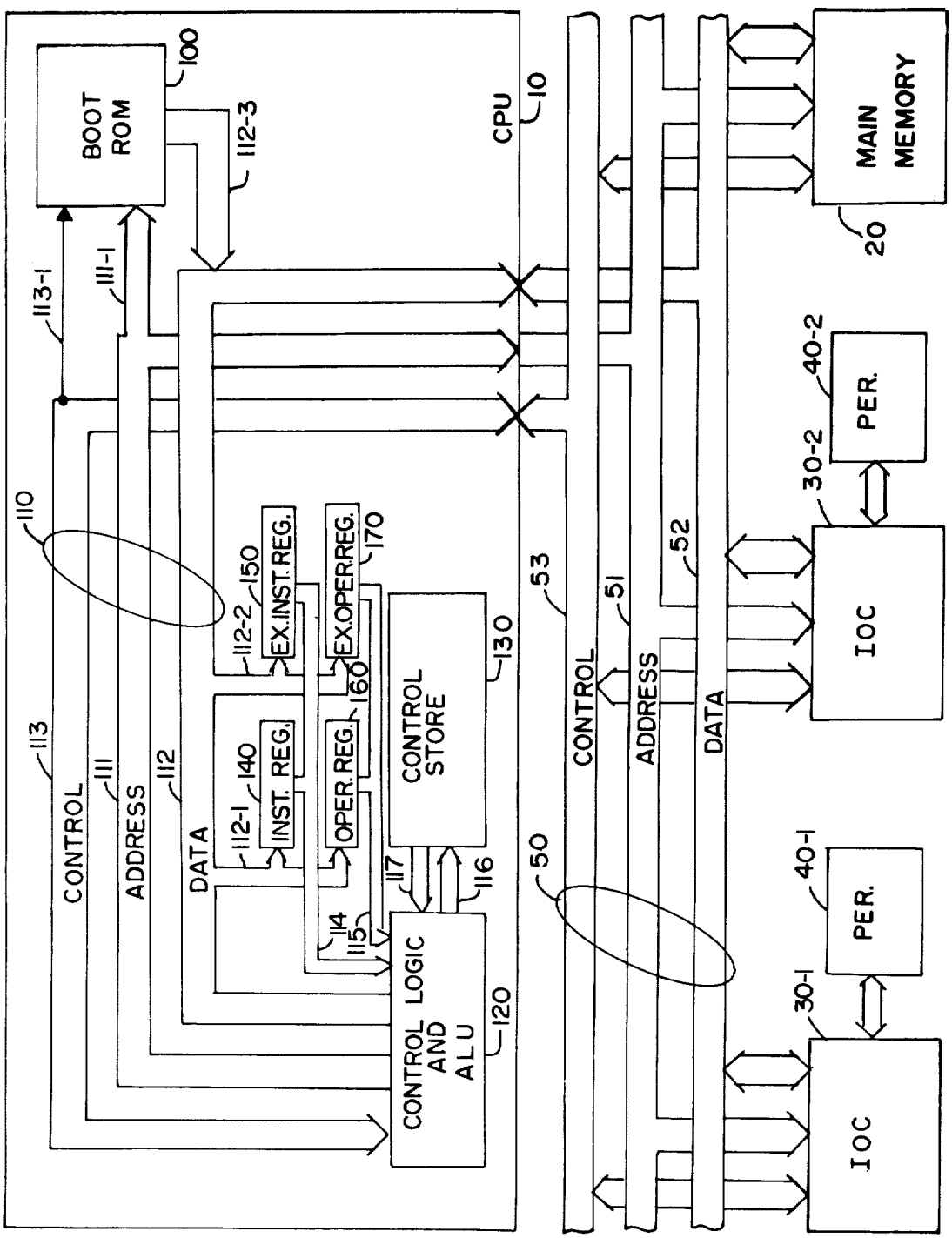
FIG. 1 is a block diagram of a system employing the instant invention.

FIG. 1 illustrates a system incorporating the present invention. The main components of FIG. 1 are CPU 10, main memory 20, input/output controller (IOC) 30-1, and input/output controller 30-2, all of which are connected by main bus 50. The input/output controllers each have attached to them one peripheral device such as a magnetic tape unit or line printer. Peripheral device (PER.) 40-1 is connected to input/output controller 30-1 and peripheral device 40-2 is connected to input/output controller 30-2.

The main bus 50 which connects the CPU 10, the main memory 20 and IOC's 30-1 and 30-2 is comprised of 3 sub-buses: main address bus 51, main data bus 52, and main control bus 53. In the preferred embodiment, main address bus 51 is 24 bits (bits 0–23) and is used to carry binary encoded addresses representing an address of a 16-bit word in main memory 20. Main data bus 52 is 32 bits wide (bits 0–31) so that it can transfer simultaneously two 16-bit words in parallel. At times only a single 16-bit word is transferred on main data bus 52. In the single word case, the word appears in the leftmost bits (0–15) and the rightmost bits (16–31) of main data bus 52 are not used. Main control bus 53 is used for control and timing on main bus 50 and contains approximately 30 signal lines.

The main components of CPU 10 are: boot read only memory (R0M) 100, control logic and arithmetic logic unit (ALU) 120, control store 130 and internal bus 110. Internal bus 110 is comprised of control bus 113, address bus 111 and data bus 112. In the preferred embodiment, boot ROM contains a memory equivalent to 1K (1K=1,024) 16-bit words although as will be seen below it physically contains 1K of 32-bit words. Boot ROM 100 is connected to the control logic and ALU 120 by the internal bus 110. Control ogic and ALU 120 in the preferred embodiment contains a microprocessor which receives its microprogram from control store 130 via microinstruction data bus 117. The control store is addressed by microinstruction address bus 116.

When the control logic and ALU 120 requires data to be used as a software instruction, it either receives it from instruction register (INST.REG.) 140, when only a single word (16-bit) instruction is required, or instruction register 140 and extended instruction register (EX.INST.REG.) 150 when a double word (32-bit) instruction is required. When the control logic and ALU 120 requires data to be used as an operand, it receives it from operand register (OPER.REG.) 160 when a single word (16-bit) operand is required or it receives it from operand register 160 and extended operand register (EX.OPER.REG.) 170 when a double word (32-bit) operand is required. When control logic and ALU 120 needs a software instruction, it doesn't know whether it's going to take it from 140 or 140 and 150 unitl it examines the contents of instruction register 140 and determines if it is a single or double word instruction. Therefore, whenever an instruction is needed, both 140 and 150 are loaded so that a 32-bits wide instruction will be available even though only 16 bits may be required for the next software instruction. Each time the instruction register is loaded, both the instruction register 140 and extended instruction register 150 are loaded to accommodate a potential 32-bit instruction. A similar situation exists with respect to loading operands into operand register 160 and extended operand register 170. Therefore, each time control logic and ALU 120 determines that an operand is needed from main memory, the operand register is always loaded with 32 bits of data even though only 16 bits may be required for instructions involving single word operands.

The following example will illustrate the loading of the instruction register 140 and extended instruction register 150. Assume that the CPU 10 is going to execute the instruction in location 3. The control logic and arithmetic logic unit 120 would place on the internal address bus 111, the binary address corresponding to location 3 (000,000,000,000,000,000,000,011 in 24 binary digits) whoch would then appear on main address bus 51. During normal operation, all data fetched from memory is read from main memory 20 by control logic and ALU 120, disabling boot ROM 100 by a signal on control line 113-1 from internal control bus 113 and by enabling main memory 20 by a signal on main control bus 53 from internal control bus 113. Thus, during normal operation, main memory 20 would fetch from location 3 the 16-bit data word located at physical address 3 and also fetch the 16-bit data word located at address 4. Main memory 20 would place the contents of location 3 and the contents of location 4 on main data bus 52 such that two 16-bit words would be transferred in parallel via 32-bit wide main data bus 52 and then via 32-bit wide internal data bus 112 to the instruction registers. The contents of location 3 would be in the leftmost word in bits 0–15 and the contents of location 4 in the rightmost word in bits 16–31 on the data buses. The contents of location 3 would be loaded into instruction register 140 via data bus 112-1 and the contents of location 4 would be loaded into extended instruction register 150 via data bus 112-2. As the instruction in the instruction register was executed by the control logic and ALU logic unit 120, if it found that it only needed a 16-bit instruction, it would use the 16 bits in instruction register 140 and upon completing the execution of that instruction, it would then execute the instruction in location 4. During the execution of the instruction from location 3, the control logic and ALU 120 would fetch the next instruction to be executed by loading instruction register 140 with the contents of memory location 4 and extended instruction register 150 with the contents of memory location 5.

Assuming that the instruction in location 3 only requires a single word of data for its execution, during its execution the control logic and ALU 120 would fetch the next instruction into the instruction register. Control logic and ALU 120 would do the next instruction fetch by placing the address in the next instruction, which would be location 4, on the internal address bus 111 which in turn would be passed to the main memory 20 via main address bus 51. Main memory 20 would then fetch the 16-bit words from locations 4 and 5 from memory and place them on data bus 52 which would be transferred internal data bus 112 such that the contents of location 4 would be loaded into instruction register 140 and the contents of location 5 would be loaded into extended instruction register 150.

As can be seen from the above example, whenever the control logic and ALU 120 addresses main memory 20 for an instruction, it places control signals on internal control bus 113 and main control bus 53 which indicates that two consecutive 16-bit words are to be fetched. The first word to be fetched from the location whose address appears on the address bus. The main memory responds by fetching the addressed 16-bit data word and the 16-bit word at the address plus one and places them on the bus in parallel for transfer to the CPU 10. In order to permit two words to be fetched and returned in parallel, main memory 20 is organized into two 16-bit word banks such that a fetch within each bank, an odd bank and an even bank, can be done simultaneously instead of serially fetching two 16-bit words from a single bank. This fetching and transferring of two 16-bit words in parallel effectively halves the memory access time and doubles the bus data transfer rate.

The above instruction fetch example will be examined in more detail by now referring to FIG. 2. Within FIG. 2, the main components are an even bank memory 21, an odd bank memory 22, multiplexers 23 and 24, incrementor 25, and control and timing logic 26. Even bank memory 21 contains 64K of 16-bit words and odd bank memory 22 also contains 64K of 16-bit words so that main memory 20 contains a total of 128K words of 16 bits each. An address when presented to the main memory 20 on main address bus 51, which in the preferred embodiment comprises 24 bits (0-23), is presented to the even bank 21 and the odd bank 22 as follows. Control and timing logic 26 responds to control signals from the CPU 10 or IOC's 30-1 or 30-2 transferred via main control bus 53. These signals control the reading or writing of information from or into main memory 20. When the control signals indicate that a memory read is required, control and timing logic 26 determines whether the location defined by the address from main address bus 51 on address bus (61-3 is within main memory 20 and if so, enables memory banks 21 and 22 to perform a read or write operation via a signal on line 64 applied to their enabled (ENB) inputs.

The 24 bits of address appearing at incrementor inputs 25-1 are incremented by incrementor 25 which adds one to the binary encoded address on the address bus 61 from main address bus 51. The incremented address appears at incrementor outputs 25-2. The most significant 23 bits of the incremented address (bits 0–22) are presented as the address to address inputs (ADDR.) 21-1 of even bank 21 via address bus 65-1. The most significant 23 bits of the unincremented address are presented as the address to address inputs 22-1 of odd bank 22 via address bus 61-2.

The 16-bit data word retrieved from even bank 21 appears on data bus 67 via data outputs (DATA) 21-3 and the 16-bit data word retrieved from odd bank 22 appears on data bus 28 via data outputs 22-3. Both of the 16-bit words fetched from even bank 21 and odd bank 22 are presented to two 2 to 1 multiplexers 23 and 24. Multiplexers 23 and 24 are arranged in a "crossbar" arrangement such that, by selecting one or the other of their 16-bit inputs, the two 16-bit outputs of the multiplexers will either present the data from even bank 21 and odd bank 22 in a straight-through mode or a crossed mode as will become clear as described below.

The choice between the straight-through mode or the crossed mode is made so that the two 16-bit word presented as output by main memory 20 to main data bus 52 will always be presented with the lower addressed location in the leftmost word (bits 0–15) and the higher (next) addressed location in the rightmost word (bits 16–31) on the 2-word wide data bus. The selection of straight-through or crossed mode by multiplexers 23 and 24 is controlled by the low order address bit from address bus 61 which appears via address line 61-1 at the select (SEL) input of multiplexers 23 and 24 such that when the address presented to main memory 20 via address bus 51 is an even address, the data will flow straight-through multiplexers 23 and 24 and when the address is an odd address, the data will be crossed by multiplexers 23 and 24.

In FIG. 2, the number without parentheses appearing on the outside of the blocks represeting 16-bit data words in even bank 21 and odd bank 22 represent the physical address of the 16-bit data words and range from 0 to 64K−1. The numbers within parentheses (those appearing inside the blocks representing the 16-bit data words in banks 21 and 22) represent the logical addresses of the 16-bit data words in main memory 20 and range from 0 to 128K−2 for even bank 21 and 1 to 128K−1 for odd bank 22. The letters (those appearing inside the blocks representing the 16-bit data words in banks 21 and 22) represent the contents of the 16-bit data words. For example, physical location 2 of even bank 21 is logical location 4 of main memory 20 and the 16-bit data word contains EE whereas physical location 2 of odd bank 22 is logical location 5 of main memory 20 and contains FF.

Continuing the above example in greater detail, assume that the CPU 10 wants to retrieve the contents of locations 3 and 4 from main memory 20; it presents the address of location 3 to main memory 20 on main address bus 51. To retrive logical locations 3 and 4 of main memory 20, physical location 1 of odd bank 22 and physical location 2 of even bank 21 must be read. To do this, main memory 20 uses the addresses from main address bus 51 as follows. The address is incremented by incrementor 25, changing the address from location 3 to location 4 at incrementor outputs 25-2. The 23 most significant bits of the incremented address are used to address even bank 21 such that the address of physical even bank location 2 it is presented to even bank 21 at address inputs 21-1 (4 decimal equals 100 binary which when the least significant bit is removed is equal to 010 binary which equals 2 decimal). The 23 most significant bits of the address on address bus 61-2 are presented as the address to odd bank 22 at address inputs 22-1. Discarding the least significant bit (bit 23) of the 24-bit unincremented address on address bus 61 results in an address on address bus 61-2 of physical location 1 being presented to odd bank 22 (3 decimal equals 011 binary which when the least signficant bit is removed is equal to 001 binary which equal 1 decimal).

The two 16-bit words are retrieved in parallel with the 16-bit data word from even bank 21 appearing on data bus 67 and the 16-bit data word from odd bank 22 appearing on data bus 68. The data on data bus 67 is presented to the 23-1 and 24-2 inputs of multiplexers 23 and 24 respectively and the data on data bus 68 is presented to the 23-2 and 24-1 inputs of multiplexers 23 and 24 respectively. The multiplexer selection is done by the least significant bit of the 24-bit address appearing on address line 61-1. In this case, a selection signal of binary ONE will result in multiplexer 23 transferring to its outputs 23-3 the data appearing at inputs 23-2 and multiplexer 24 will have transferred to its outputs 24-3 the data appearing at inputs 24-2. This selection process results in the crossing of the even and odd words such that the odd bank word appears as the most significant 16-bit word on data bus 62 and main data bus 52 and the even bank word appears as the least significant 16-bit word on data bus 62 and main data bus 52. Thus the leftmost 16-bit word on main bus 52 will be physical location 1 of odd bank 22 (logical location 3 which contains DD) and the rightmost 16-bit word on main bus 52 will be physical location 2 of even bank 21 (logical location 4 which contains EE).

Taking the above example one step further, if the CPU 10 addressed word 4 in main memory, the main memory 20 will present to data bus 52 the contents of 16-bit locations 4 and 5. This is done as follows. The address on address bus 61 is incremented by incrementor 25 such that input address 4 becomes address 5 at the output 25-2 of the incrementor 25 and the address on address bus 65-1 is the address of physical location 2 in even bank 21, the binary value of decimal 5 (0101) with the low order bit removed is 010 (decimal 2) so the content of physical location 2 in even bank 21 is retrieved and placed on data bus 67 and is presented to multiplexers 23 and 24. The address presented to odd bank 22 on address bus 61-2 is physical location 2 which is the result of discarding the least significant bit (bit 23) of the address of decimal 4 (100 binary). The output of odd bank 22 appears on data bus 68 and is presented to the multiplexers 23 and 24.

The multiplexer selection is again done by the least significant bit of the address appearing on address line 61-1, but in this case a selection signal of binary ZERO will result in multiplexer 23 transferring to its outputs 23-3 the data appearing at inputs 23-1 and multiplexer 24 will have transferred to its outputs 24-3 the data appearing at inputs 24-1. This selection process results in the straight-through passing of the even and odd words such that the even bank word appears as the most significant 16-bit word on data bus 62 and main data bus 52 and the odd bank word appears on the least significant 16-bit word on data bus 62 and main data bus 52. Thus the leftmost 16-bit word on main bus 52 wil be physical location 2 of even bank 21 (logical location 4 which contains EE) and the rightmost 16-bit word on main bus 52 will be physical location 2 of odd bank 22 (logical location 5 which contains FF).

Although FIG. 4 illustrates only the case of retrieving data from main memory, similar data multiplexing logic is provided for storing dat into main memory. For writing two 16-bit data words in parallel into main memory 20, multiplexers similar to 23 and 24 are provided but their inputs are connected to data buses 62-1 and 62-2 and the output of one is connected to data bus 67 and the output of the other is connected to data bus 68. The multiplexer input selection is again done by the low order address bit on line 61-1 and the addressing of the even bank 21 and odd bank 22 uses the same logic as shown in FIG. 2 for the read from memory.

FIG. 3 illustrates in greater detail the arrangement of boot ROM 100. In the preferred embodiment, boot ROM 100 contains 1,024 (1K) physical words of 32 bits each which is organized to be the equivalent of 1,024 different logical words of 16 bits each. In FIG. 3, the number without parentheses (those outside the blocks representing logical 16-bit data words) represent the physical address of the 32-bit data words, each of which contains two 16-bit logical words with physical addresses ranging from 0 to 1,023. The numbers within parentheses (those appearing inside the blocks representing the 16-bit logical words) represent the logical address of the 16-bit logical words in boot ROM 100 and range from 0 to 1,024. The letters (those appearing inside the blocks representing the 16-bit logical data words) represent the contents of the 16-bit logical data words. For example, physical location 2 of boot ROM 100 contains logical locations 2 and 3 the contents of which are 16-bit logical words containing C and D respectively.

When the CPU wants to retrieve a pair of words from boot ROM 100 instead of main memory 20, control logic and ALU 120 conditions the boot ROM by placing a control signal on control line 113-1 which is received at the enable (ENB) input of boot ROM 100. This enabling of boot ROM 100 also disables main memory 20 so that only boot ROM 100 will respond to the read request. Control logic and ALU 120 also places the addresses on internal address bus 111, the low order 10 bits of which are transferred to the address (ADDR.) inputs 100-1 of boot ROM 100. Only the 10 lower bits of the 24-bit address are used because the boot ROM contains only 1,024 words of data. The 10-bit address on address bus 111-1 is used directly by boot ROM 100, including the low order bit. The 32-bit physical data word read from boot ROM 100 appears at outputs 100-2 and is fed directly back to internal data bus 112 via data bus 112-3 without requiring any switching (crossbaring) of the two 16-bit logical data words before they are presented to data bus 112.

To show the operation of boot ROM 100 and to contrast the retrieval of data from boot ROM 100 with the retrieval of data from main memory 20, we will again take the example of the control logic and ALU 120 retrieving the 16-bit contents of location 3 and location 4 which will be returned on internal data bus 112 via data bus 112-3. We will then proceed to the case of control logic and ALU 120 retrieving the 16-bit words at location 4 and location 5 which will be returned on internal data bus 112 via data bus 112-3.

As described above, boot ROM 100 is organized in the preferred embodiment to contain 1,024 (1K) words of 32 bits each which are organized to be equivalent to 1,024 logical words of 16 bits each. In boot ROM 100, each physical 32-bit word contains two logical 16-bit words. In each physical 32-bit word, the leftmost logical 16-bit word contains the contents of the logical word having a logical address that is the same as the physical address of the 32-bit word that contains it. The rightmost logical 16-bit word contains the contents of the logical word having the logical address that is one greater than the physical address of the 32-bit word that contains it. Thus, for example, physical location 1 contains logical locations 1 and 2 and physical location 2 contains logical locations 2 and 3. This results in each 16-bit logical data word, with the exception of the logical locations 0 and logical locations 1,024, being duplicated in boot ROM 100. By duplicating data in this manner, it allows one 32-bit word to be retrieved from boot ROM 100 which always contains the proper two 16-bit data words, regardless whether an even or an odd address is presented to the boot ROM. This arrangement eliminates the requirement of crossbaring the output of an odd and even bank as is done in main memory 20 and further relieves the requirement of having to do an increment on the address presented to the memory.

This elimination of the crossbaring of the data and the incrementing of the address eliminates logic within the boot ROM and results in the ROM containing fewer circuit components, thus involving less logic during the initial execution of the program from the boot memory. This helps assure that for diagnostic purposes less logic is involved during the initial loading of the software from the boot ROM. This arrangement also has the advantage that the overall speed and timing within the system need not be changed depending upon whether the information is being retrieved from boot ROM 100 or from main memory 20, therefore allowing for a lower cost ROM to be used and still achieve an effective read time equal to that of a higher speed main memory. The higher speed in the main memory being required to allow for the time necessary to increment the address and to do the multiplexing of the data retrieved from the main memory. This arrangement of the boot ROM also has the added advantage that it reduces cost by eliminating the logic circuits needed for address incrementing and the data multiplexing.

Although the preferred embodiment has been described in terms of a read only memory from which information is only read, the principles of this invention can also be applied to a read/write memory. In such a case, the reading operations would be performed as described above but write operations would require that each 16-bit logical data word to be stored twice within the memory, once in the rightmost 16 bits of the physical word having a physical address of one less than the logical address and once in the leftmost 16 bits of the physical address having a physical address the same as the logical address. For example, a logical word having an address of 3 would be stored in the rightmost 16 bits of physical word 2 and the leftmost 16 bits of physical word 3.

Although the invention has been described in terms of a read only memory in which the multiple copies of the data are prestored, it is equally applicable to a read/write memory. In a read/write memory, the multiple copies of the data could be by presenting each logical word sequentially along with its logical address or by presenting multiple consecutive logical words in parallel along with the address of the first logical word. In either case, multiple writes in memory would be required.

If multiple words are to be stored in parallel, the number of writes to memory increases. For example, if logical words 3 and 4 are presented to memory in parallel, they could be immediately stored in physical location 3 without alignment, followed by an interchange (crossbaring) of the two logical words such that logical word 4 is in the leftmost position and logical word 3 is in the rightmost position. Physical locaton 2 could then be read from the memory and then rewritten with the new logical word 3 replacing the old logical word 3 in the rightmost position. Physical location 4 could then be read from the memory and then rewritten with the new logical word 4 replacing the old logical word 4 in the leftmost position. As can be appreciated, this process requires address decrementing and incrementing logic and data crossbaring logic and multiple memory reads and writes, but could be useful if the advantages of a fast multiword information retrieval offsets the disadvantages of slow information storage.

Although the preferred embodiment has been described in terms of reading two 16-bit data words in parallel, the same principles apply to any multiple of different length data words. If, for example, three 20-bit words are to be read in parallel, the ROM would contain physical words of 60 bits each, each containing three 20-bit logical words. The contents of physical location 10 would contain logical location 10 in the 20 leftmost bits, logical location 11 in the 20 middle bits, and location location 12 in the 20 rightmost bits. Similarly, physical location 11 would contain logical locations 11, 12 and 13 and physical location 12 would contain logical locations 12, 13 and 14. Thus each logical word will appear in the ROM as many times as the number of words to be read in parallel—3 times in the above example.

Although the above discussion has been in terms of the most significant bits or words being positioned to the left, the present invention is equally applicable if the most significant bits or words are positioned to the right. Further, all the bits within a logical data word need not be stored consecutively within a physical data word and the multiple data words could be interleaved. For example, if three words are to be retrieved in parallel, one logical word could be stored by using each third bit in the physical data words.

While the invention has been shown and described with reference to the preferred embodiment thereof, it will be understood by those skilled in the art that the above and other changes in form and detail may be made therein without departing from the spirit and scope of the invention.

What is claimed is:

1. A method for storing and retrieving N multiple consecutive logical words of data in parallel from a memory, each of said logical words of data having a logical word length of L bits, said method comprising:
  A. storing said logical words of data in physical words of data having a physical word length equal to at least N times L bits by;
  B. in a first one of said physical words of data, storing said logical word of data having a logical address corresponding to a physical address of said physical word of data in a leftmost L bits within said physical word of data;
  C. in each of said physical words of data, storing an other logical word of data having a logical address one greater than said logical word of data stored in the L bits to the left of said other logical word of data in said physical word of data;

D. returning to step C until N logical words of data are stored in said physical word of data such that said logical addresses of said N multiple consecutive logical words of data in said physical word of data increase from left to right within said physical word of data;

E. returning to B for a next one of said physical words of data until each physical word of data has N logical words of data stored in each of said physical words so that said memory has stored therin N multiple copies of each of said logical words of data, except for a first and last N−1 logical words of data;

F. addressing said memory when the retrieval of N multiple consecutive logical words of data is desired by presenting a logical address of a first of said N multiple consecutive logical words of data to be read from said memory; and G. reading said physical word of data whose said physical address corresponds to said logical address of said first of said N multiple consecutive logical words of data, whereby N multiple consecutive logical words of data are retrieved in parallel by one memory read in the time required to read one of said physical words of data from said memory without having to do any address incrementing or decrementing to read any group of said N multiple consecutive logical words of data and wherein a first through N−1 logical words of data, within any said group of said N multiple consecutive logical words of data as read from said memory, is located in the same relative position within said physical words of data without requiring any alignment of said logical words of data.

2. The method of claim 1 wherein N is 2 and L is 16.

3. A method for storing and retrieving N multiple consecutive logical words of data in parallel from a memory, each of said logical words of data having a logical word length of L bits, said method comprising:

A. storing said logical words of data in physical words of data having a physical word length equal to at least N times L bits by;

B. storing N multiple consecutively addressed logical words of data in each of said physical words of data, a first of said N multiple consecutively addressed logical words of data in each of said physical words of data having a logical address corresponding to a physical address of said physical word of data;

C. repeating step B until each physical word of data has N logical words of data stored in said physical word so that said memory has stored therein N multiple copies of each of said logical words of data, except for a first and last N−1 logical words of data;

D. addressing said memory when the retrieval of N multiple consecutive logical words of data is desired, by presenting a logical address of said first of N multiple consecutive logic words of data to be read from said memory; and E. reading said physical word of data whose said physical address corresponds to said logical address of said first of N multiple consecutive logical words of data, whereby N multiple consecutive logical words of data are retrieved in parallel by one memory read in the time required to read one of said physical words of data from said memory without requiring any address incrementing or decrementing to read any group of said N multiple consecutive logical words of data and wherein a first through N−1 logical words of data, within any said group of said N multiple consecutive logical words of data as read from said memory, is located in the same relative position within said physical words of data without requiring alignment of said logical words of data.

4. The method of claim 3 wherein said memory is a read only memory and wherein said logical words are prestored therein.

5. The method of claim 3 wherein said memory is a read/write memory and wherein said only one of said logical words of data and its corresponding logical address is presented at a time for writing in said memory and wherein it is stored in said N consecutive physical words of data shifted one logical word position in each consecutive physical words of data.

6. The method of claim 5 wherein said memory is a read/write memory and N multiple consecutive logical words of data and the logical address of the first of said N multiple consecutive logical words of data are presented at a time for writing in said memory and wherein the writing into said N physical words of data is done using address increments and decrements and data alignment.

7. A memory for retrieving N multiple consecutive logical words of data in parallel, said memory comprising:

A. a plurality of physical words of data, each of said plurality of physical words of data being of a length sufficient to contain N of said logical words of data;

B. addressing means for addressing a specified one of said plurality of physical words of data by using an address of a first of said N multiple consecutive logical words of data to be read from said memory, said memory having stored therein N multiple copies of each of said logical words of data, except for a first and last N−1 logical words of data; and C. data output means for receiving said N multiple consecutive logical words of data from said specified one of said plurality of physical words of data read from said memory in the time required to read one of said physical words of data and wherein each of said physical words of data contains N multiple consecutive logical words of data having N consecutive logical addresses and wherein said first of said N multiple consecutive logical words of data has a logical address corresponding to a physical address of said physical word of data in which it is stored and whereby said reading of said N multiple consecutive logical words of data does not require any address incrementing or decrementing to read any group of said N multiple consecutive logical words of data and wherein a first through N−1 logical words of data, within any said group of said N multiple consecutive logical words of data as read from said memory, is located in the same relative position within said physical words of data without requiring any alignment of said logical words of data within said data output means.

8. The memory of claim 7 wherein said memory is a read only memory and wherein said logical words of data are prestored therein.

* * * * *